(12) United States Patent
Chu et al.

(10) Patent No.: US 8,934,312 B2
(45) Date of Patent: Jan. 13, 2015

(54) PROCESS VARIATION SKEW IN AN SRAM COLUMN ARCHITECTURE

(71) Applicant: International Business Machines Corporation, Armonk, NY (US)

(72) Inventors: Albert M. Chu, Nashua, NH (US); Daryl M. Seitzer, Essex Junction, VT (US); Rohit A. Shetty, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 13/753,989

(22) Filed: Jan. 30, 2013

(65) Prior Publication Data

US 2014/0211581 A1 Jul. 31, 2014

(51) Int. Cl.
*G11C 29/00* (2006.01)
*G11C 29/08* (2006.01)
*G06F 17/50* (2006.01)

(52) U.S. Cl.
CPC ................ *G11C 29/08* (2013.01); *G06F 17/50* (2013.01)
USPC .................. 365/201; 365/189.05; 365/189.07; 365/189.11; 365/154; 365/230.06

(58) Field of Classification Search
CPC .... G11C 7/1045; G11C 11/419; G11C 7/065; G11C 7/1051; G11C 7/1069; G11C 7/12
USPC .................. 365/189.05, 189.07, 189.11, 154, 365/230.06
See application file for complete search history.

(56) References Cited

U.S. PATENT DOCUMENTS

| | | | |
|---|---|---|---|
| 7,333,379 B2 | 2/2008 | Ramadurai et al. | |
| 7,681,103 B2 | 3/2010 | Devadas et al. | |
| 8,130,955 B2 | 3/2012 | Trichina et al. | |
| 8,159,260 B1 | 4/2012 | Behrends et al. | |
| 2008/0101132 A1* | 5/2008 | Huang | 365/189.07 |
| 2009/0271860 A1 | 10/2009 | Nonaka et al. | |
| 2011/0317829 A1 | 12/2011 | Ficke et al. | |
| 2012/0020145 A1 | 1/2012 | Huber et al. | |
| 2012/0066571 A1 | 3/2012 | Marinet | |
| 2012/0072476 A1 | 3/2012 | Bucci et al. | |

OTHER PUBLICATIONS

Vivekraja et al., "Feedback Based Supply Voltage Control for Temperature Variation Tolerant PUFs", 2011 24th Annual Conference on VLSI Design, pp. 214-219.
"Physically Unclonable Function Enhancement to Guarantee Repeatable Behavior", ip.com Prior Art Database, Technical Disclosure, Aug. 31, 2010, 5 pages.

* cited by examiner

*Primary Examiner* — Thong Q Le
(74) *Attorney, Agent, or Firm* — David A. Cain; Hoffman Warnick LLC

(57) ABSTRACT

Aspects of the invention provide for a structure and method for determining a degree of process variation skew between a plurality of bit cells in a static random-access-memory (SRAM) column architecture. In one embodiment, a structure includes: a plurality of bit cells within a static random access memory (SRAM) column architecture; a digital-to-analog converter (DAC) connected to the bit cells through a pair of multiplexers; and a pre-charge circuit connected to the bit cells through the pair of multiplexers, wherein the DAC and the pre-charge circuit control and test the bit cells to determine a degree of process variation skew between each of the bit cells.

20 Claims, 5 Drawing Sheets

PROCESS VARIATION SKEW IN AN SRAM COLUMN ARCHITECTURE

FIELD OF THE INVENTION

The disclosure relates generally to integrated circuits, and more particularly, to a structure and a method for determining a degree of process variation skew between a plurality of bit cells in a static random-access-memory (SRAM) column architecture.

BACKGROUND

For some applications, there is a need to create a secure hardware based identification (ID). The ID needs to be randomly created, non-volatile, and unobservable when subjected to failure analysis (FA). For example, for field programmable gate array (FPGA) programming, secure IDs are used for coding encryption.

Static random-access-memory (SRAM) bit cells may be used to create the secure ID. However, SRAM bit cells initialize based on process variation. Many SRAM bit cells may initialize to a different state, depending on environmental conditions.

BRIEF SUMMARY

Aspects of the invention provide for a structure and method for determining a degree of process variation skew between a plurality of bit cells in a static random-access-memory (SRAM) column architecture. In one embodiment, a structure includes: a plurality of bit cells within a static random access memory (SRAM) column architecture; a digital-to-analog converter (DAC) connected to the bit cells through a pair of multiplexers; and a pre-charge circuit connected to the bit cells through the pair of multiplexers, wherein the DAC and the pre-charge circuit control and test the bit cells to determine a degree of process variation skew between each of the bit cells.

A first aspect of the disclosure provides a structure, comprising: a plurality of bit cells within a static random access memory (SRAM) column architecture; a digital-to-analog converter (DAC) connected to the bit cells through a pair of multiplexers; and a pre-charge circuit connected to the bit cells through the pair of multiplexers, wherein the DAC and the pre-charge circuit control and test the bit cells to determine a degree of process variation skew between each of the bit cells.

A second aspect of the disclosure provides a method for determining a degree of process variation skew between a plurality of bit cells within a static random-access-memory (SRAM) column architecture, the method comprising: setting a pre-charge circuit to equalize each of the plurality of bit cells to a bit line voltage; reading a first output of a first bit cell; adjusting, using a digital-to-analog converter (DAC), the bit line voltage to modify an output of the first bit cell until a second output of the first bit cell is opposite that of the first output; and storing the adjusted bit line voltage for the first bit cell.

A third aspect of the disclosure provides a design structure tangibly embodied in a machine readable medium for designing, manufacturing, or testing an integrated circuit, the design structure comprising: a plurality of bit cells within a static random access memory (SRAM) column architecture; a digital-to-analog converter (DAC) connected to the bit cells through a pair of multiplexers; and a pre-charge circuit connected to the bit cells through the pair of multiplexers, wherein the DAC and the pre-charge circuit control and test the bit cells to determine a degree of process variation skew between each of the bit cells.

BRIEF DESCRIPTION OF THE DRAWINGS

The above and other aspects, features and advantages of the disclosure will be better understood by reading the following more particular description of the disclosure in conjunction with the accompanying drawings.

Figure 1:
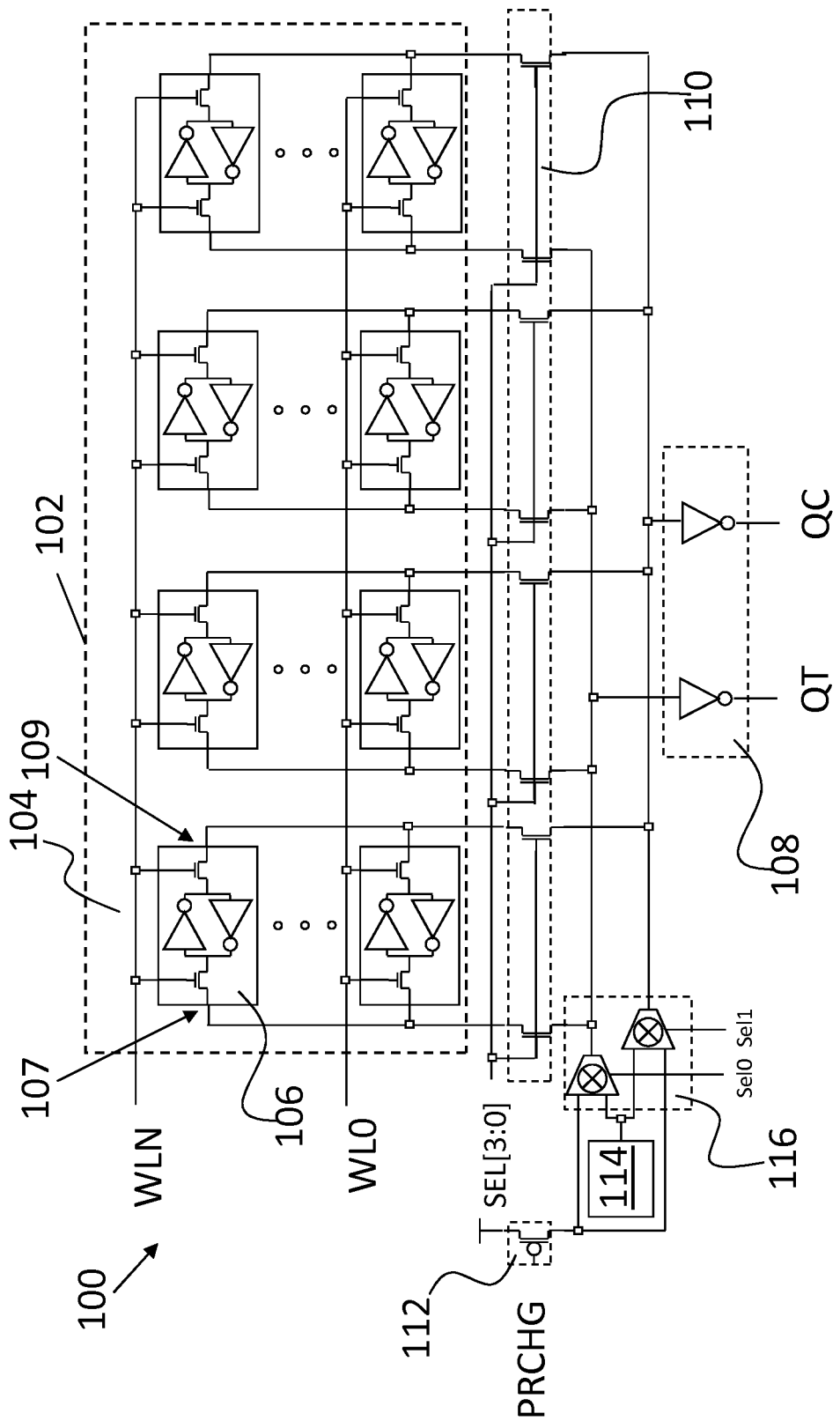
FIG. 1 shows a schematic diagram of a structure according to embodiments of the invention.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

The disclosure relates generally to integrated circuits, and more particularly, to a structure and a method for determining a degree of process variation skew between a plurality of bit cells in a static random-access-memory (SRAM) column architecture.

As mentioned above, for some applications, there is a need to create a secure hardware based identification (ID). The ID needs to be randomly created, non-volatile, and unobservable when subjected to failure analysis (FA). For example, for field programmable gate array (FPGA) programming, secure IDs are used for coding encryption.

Static random-access-memory (SRAM) bit cells may be used to create the secure ID. However, SRAM bit cells initialize based on process variation. Many SRAM bit cells may initialize to a different state, depending on environmental conditions.

Prior art attempts have tried to leverage the initialization sensitivity of process variation on SRAM bit cells by utilizing error correcting codes and other logic, in order to create a random number that can be initialized in repeatable fashion.

Aspects of the invention provide for a structure and method for determining a degree of process variation skew between a plurality of bit cells in a static random-access-memory (SRAM) column architecture in order to determine the bit cells that consistently initialize in the same state. Those bit cells and their corresponding bit addresses may be used to create the secure IDs. In one embodiment, a structure includes: a plurality of bit cells within a static random access memory (SRAM) column architecture; a digital-to-analog converter (DAC) connected to the bit cells through a pair of multiplexers; and a pre-charge circuit connected to the bit cells through the pair of multiplexers, wherein the DAC and the pre-charge circuit control and test the bit cells to determine a degree of process variation skew between each of the bit cells.

Turning now to FIG. 1, a structure 100 for determining process variation skew between a plurality of bit cells 102 within a static random-access-memory (SRAM) column architecture 104 according to embodiments of the invention is shown. The SRAM column architecture 104 is shown with four (4) columns. However, it is understood that this is for exemplary purposes only. SRAM column architecture 104 may include any number of columns, as required. Further, each column in SRAM column architecture 104 may include any number (N) of word lines (WL0-WLN). For example, a column in SRAM column architecture 104 may include 64 word lines, or 128 word lines. Each column within SRAM column architecture 104 includes one or more bit cells 106. The number of bit cells 106 in a column is dependent on the number of word lines in the SRAM column architecture 104, as known in the art.

Each of the bit cells 106 receives a bit line true voltage and a bit line complement voltage (e.g., via an input 107 from a first side of bit cell 106 and an input 109 from a second side of bit cell 106). An output of a bit cell 106 within the SRAM column architecture 104 is outputted via a sense amplifier 108. Sense amplifier 108 may include any sense amplifier, as known in the art, and is shown as two inverters in FIG. 1. A first output "QT" is a true output of a bit cell 106, while a second output "QC" is a complement output of the bit cell 106. That is, the complement output "QC" is opposite to that of the true output "QT." When a word line (e.g., WL0 or WLN) is activated, a selection circuit 110 selects a column in the SRAM column architecture 104, and the bit cell 106 within the activated world line and in the selected column is outputted.

A pre-charge circuit 112 and a digital-to-analog converter (DAC) 114 are connected to each of the bit cells 106 in the SRAM column architecture 104 via a pair of multiplexers 116. The pre-charge circuit 112 is shown as a p-type field effect transistor (pFET) that receives a "PRCHG" control signal. Each of the multiplexers 116 receives a selection signal ("Sel0" and "Sel1") to determine whether the "PRCHG" control signal is sent to the bit cells 106 or a signal from the DAC 114 is sent to the bit cells 106. As will be described later herein, the pre-charge circuit 112 and the DAC 114 control and test each of the plurality of bit cells 106 to determine a degree of process variation skew between each of the bit cells 106. The pre-charge circuit 112 initializes and equalizes the bit line voltages for each of the bit cells 106. The DAC 114 adjusts the bit line voltages for the bit cells 106. The bit cells 106 with the strongest bias (i.e., the bit cells that have the highest process variation) are used to create secure IDs.

Figure 2:
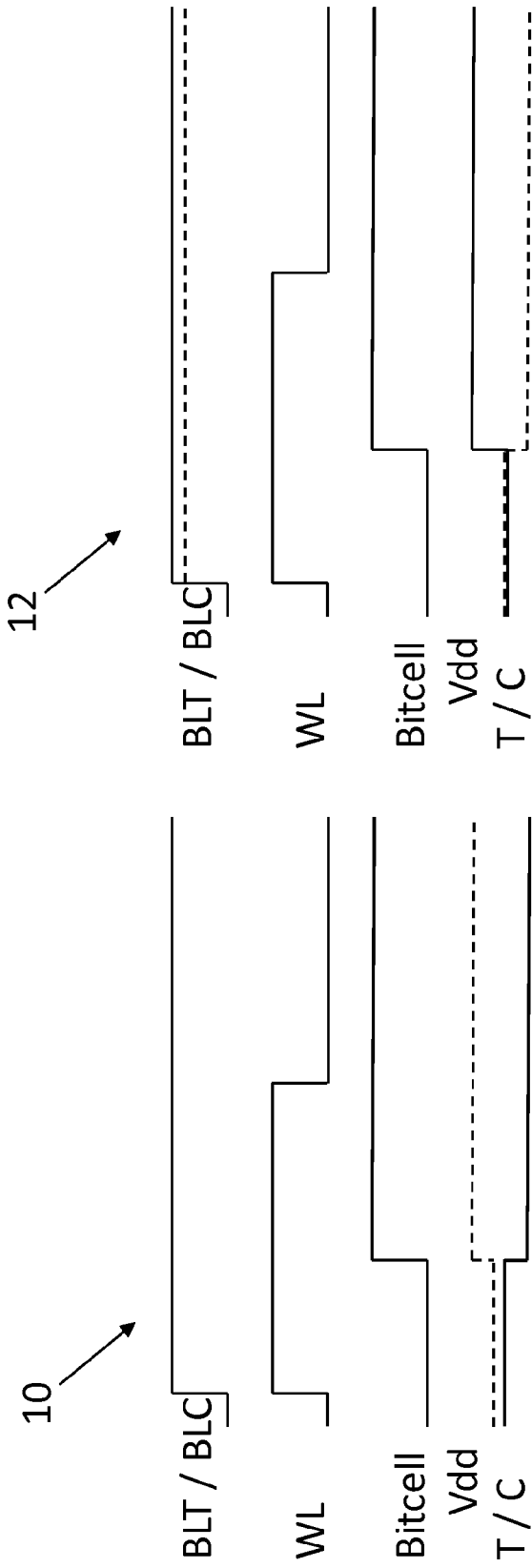
FIG. 2A shows an operational waveform according to embodiments of the invention.
FIG. 2B shows an operational waveform according to embodiments of the invention.

Turning now to FIGS. 2A and 2B, operational waveforms 10, 12 according to embodiments of the invention are shown. A first operational waveform 10 occurs when a bit line true voltage and a bit line complement for each of the bit cells 106 (FIG. 1) is equal (i.e., inputs 107 and 109 into bit cells 106 are the same). In this case, the bit line voltages "BLC" and "BLT" are equal in operational waveform 10. Once the bit cell 106 is powered up (i.e., "Bitcell Vdd" goes logic high), the true and complement outputs of the bit cell 106 are outputted. As shown in FIG. 2A, the bit cell 106 is skewed to "0". That is, the true output of the bit cell 106 is logic low (i.e., the solid line) and the complement output of the bit cell 106 is logic high (i.e., the dotted line). However, this is for exemplary purposes only. The exact opposite scenario may be true. That is, the bit cell 106 may be skewed to "1", so that the true output of the bit cell 106 may be logic high, while the complement output of the bit cell 106 may be logic low.

Using the method to determine the process variation skews that will be described later herein with regard to FIG. 3, either the true bit line voltage ("BLT") or the complement bit line voltage ("BLC"), via inputs 107, 109, are adjusted via DAC 114 to determine when the true output and the complement output of the bit cell 106 flips. As shown in the operational waveform 12 in FIG. 2B, assuming that bit cell 106 is skewed to "0" (i.e., the true output of bit cell is a logic low), DAC 114 adjusts the complement bit line voltage ("BLC"). In operational waveform 12, the complement bit line voltage "BLC" is the dotted line. The complement bit line voltage "BLC" is adjusted (e.g., lowered) by DAC 114 until the true output of bit cell 106 flips from logic low to logic high (solid line in operational waveform 12).

In the case that the bit cell 106 is skewed to "1", and the true output of bit cell 106 is logic high when the true bit line voltage "BLT" and the complement bit line voltage "BLC" are equal, the DAC 114 will lower the true bit line voltage "BLT" until the true output of the bit cell 106 is logic low. The greater the DAC 114 needs to lower the complement bit line voltage "BLC" or the true bit line voltage "BLT," the greater the process variation skew of that bit cell 106. The bit cells 106 with the greater process variation skews may be used to create secure IDs.

Figure 3:
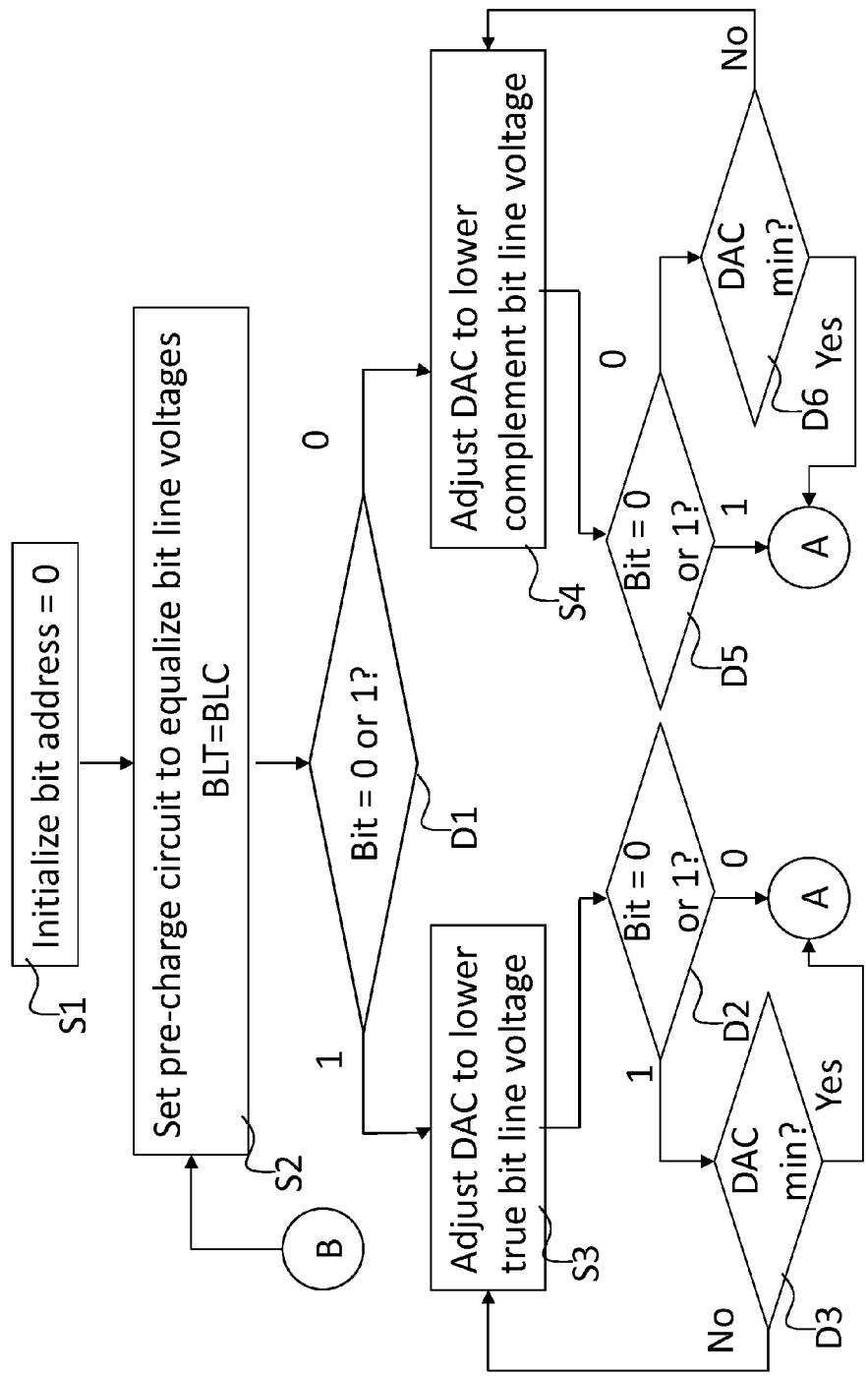
FIG. 3 shows a flow diagram for a method of determining process variation skew in a plurality of bit cells according to embodiments of the invention.
Figure 4:
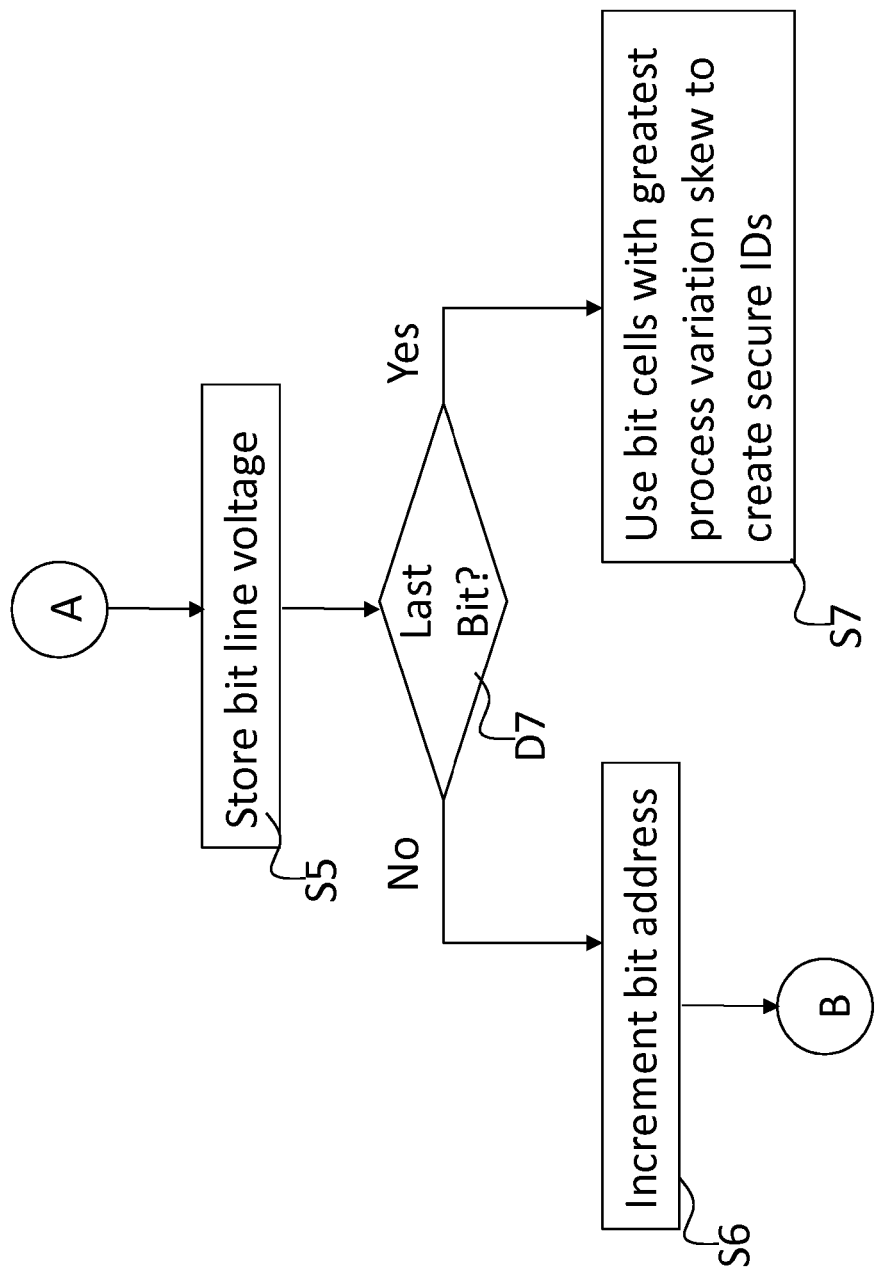
FIG. 4 shows a flow diagram for a method of determining process variation skew in a plurality of bit cells according to embodiments of the invention.

Turning now to FIGS. 3-4, with reference to the structure 100 in FIG. 1, a flow diagram of a method of determining process variation skews of a plurality of bit cells 106 within a SRAM column architecture 104 according to embodiments of the invention is shown.

At S1, the bit address is set to 0 for a first bit cell 106. At S2, the pre-charge circuit 112 equalizes each of the plurality of bit cells 106, such that the true and complement bit line voltages BLT and BLC are equal. The selected bit cell 106 is read at D1 and the true output is determined to be "0" or "1". If the true output is "1," the DAC 114 is adjusted at S3 to lower the true bit line voltage BLT. The selected bit cell 106 is read again at D2. If the true output is still "1," it is determined at D3 whether the DAC 114 has reached a minimum true bit line voltage BLT. If No, the DAC 114 is adjusted again by lowering the true bit line voltage BLT. The DAC 114 is repeatedly adjusted until the true output of the bit cell 106 is flipped to "0." Or alternatively, until the DAC 114 reaches the minimum true bit line voltage BLT.

If the complement output is "0," the DAC 114 is adjusted at S4 to lower the complement bit line voltage BLC. The selected bit cell 106 is read again at D5. If the true output is still "0," it is determined at D6 whether the DAC 114 has reached a minimum complement bit line voltage BLC. The DAC is 114 is repeatedly adjusted until the true output of the bit cell 106 is flipped to "1." Or alternatively, until the DAC 114 reaches the minimum complement bit line voltage BLC.

Following "A" to FIG. 4, in either case, if DAC 114 reaches the minimum true bit line voltage BLT or the minimum complement bit line voltage BLC, or once the true output of bit cell 106 has flipped, the bit line voltage (either true or complement) is stored at S5. If there are more bit cells 106 within the SRAM column architecture 104 to test (No at D7), the bit address is incremented at S6. Flow passes via "B" back to FIG. 3, and the method is repeated for the new bit cell 106. However, if bit cell 106 is the last bit cell 106 (Yes at D7), the bit cells 106 with the greatest process variation skews (i.e., the most adjustment via DAC 114) may be used to create secure IDs.

Figure 5:
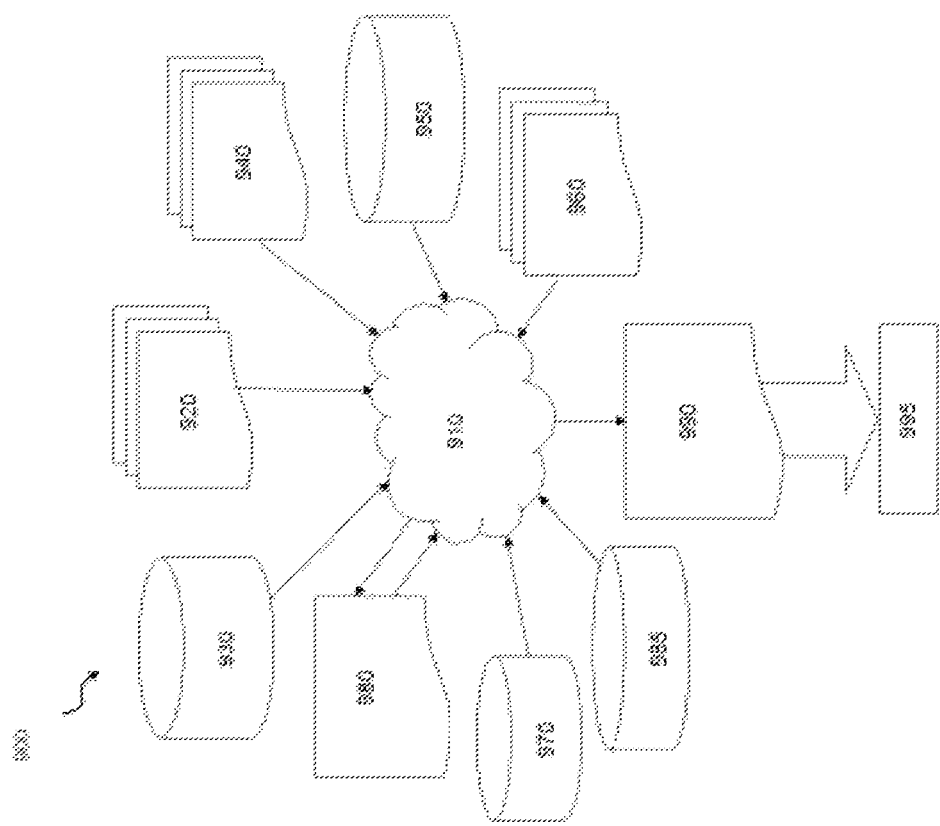
FIG. 5 is a flow diagram of a design process used in semiconductor design, manufacture, and/or test according to embodiments of the invention.

FIG. 5 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 1. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 1. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 1 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 990 may comprise a compiled, executable HDL simulation model that functionally simulates the devices shown in FIG. 1.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A structure, comprising:
    a plurality of bit cells within a static random access memory (SRAM) column architecture;
    a digital-to-analog converter (DAC) connected to the bit cells through a pair of multiplexers; and
    a pre-charge circuit connected to the bit cells through the pair of multiplexers,
    wherein the DAC and the pre-charge circuit control and test the bit cells to determine a degree of process variation skew between each of the bit cells.

2. The structure of claim 1, wherein the pre-charge circuit includes a field-effect transistor.

3. The structure of claim 2, wherein the pre-charge circuit equalizes a bit line voltage for each of the bit cells.

4. The structure of claim 1, further comprising a selection circuit for selecting a bit cell to test.

5. The structure of claim 4, wherein the DAC adjusts the bit line voltage.

6. The structure of claim 1, wherein the SRAM column architecture includes a plurality of columns.

7. The structure of claim 1, further comprising selection signals for selecting one of: a signal from the DAC or a signal from the pre-charge circuit to output from each of the pair of multiplexers to the plurality of bit cells.

8. The structure of claim 1, further comprising a sense amplifier to output a true output and a complement output in testing the bit cells.

9. A method for determining a degree of process variation skew between a plurality of bit cells within a static random-access-memory (SRAM) column architecture, the method comprising:
    setting a pre-charge circuit to equalize each of the plurality of bit cells to a bit line voltage;
    reading a first output of a first bit cell;
    adjusting, using a digital-to-analog converter (DAC), the bit line voltage to modify an output of the first bit cell until a second output of the first bit cell is opposite that of the first output; and
    storing the adjusted bit line voltage for the first bit cell.

10. The method of claim 9, further comprising:
    setting the pre-charge circuit to equalize each of the plurality of bit cells to a bit line voltage;
    reading a first output of a second bit cell;
    adjusting, using the DAC, the bit line voltage to modifying an output of the second bit cell until a second output of the second bit cell is opposite that of the first output of the second cell; and
    storing the adjusted bit line voltage for the second bit cell.

11. The method of claim 9, wherein, in response to the first output of the bit cell as a logic high, adjusting the bit line voltage includes lowering a true bit line voltage.

12. The method of claim 9, wherein, in response to the first output of the bit cell as a logic low, adjusting the bit line voltage includes lowering a complement bit line voltage.

13. The method of claim 9, wherein, in response to the DAC reaching a desired bit line voltage, storing the bit line voltage for the first bit cell.

14. A design structure tangibly embodied in a machine readable medium for designing, manufacturing, or testing an integrated circuit, the design structure comprising:
    a plurality of bit cells within a static random access memory (SRAM) column architecture;
    a digital-to-analog converter (DAC) connected to the bit cells through a pair of multiplexers; and
    a pre-charge circuit connected to the bit cells through the pair of multiplexers,
    wherein the DAC and the pre-charge circuit control and test the bit cells to determine a degree of process variation skew between each of the bit cells.

15. The design structure of claim 14, wherein the pre-charge circuit includes a field-effect transistor.

16. The design structure of claim 15, wherein the pre-charge circuit equalizes a bit line voltage for each of the bit cells.

17. The design structure of claim 14, further comprising a selection circuit for selecting a bit cell to test.

18. The design structure of claim 17, wherein the DAC adjusts the bit line voltage.

19. The design structure of claim 14, further comprising selection signals for selecting one of: a signal from the DAC or a signal from the pre-charge circuit to output from each of the pair of multiplexers to the plurality of bit cells.

20. The design structure of claim 14, further comprising a sense amplifier to output a true output and a complement output in testing the bit cells.

* * * * *